United States Patent [19]

Nakayama

[11] Patent Number: 5,808,936
[45] Date of Patent: Sep. 15, 1998

[54] NONVOLATILE MEMORY FOR TRAPPING ELECTRONS IN SELECTED CELLS DURING A PERIOD INVERSELY VARIABLE WITH A WRITE-IN VOLTAGE

[75] Inventor: Sadao Nakayama, Tokyo, Japan

[73] Assignee: NEC Corporation, Tokyo, Japan

[21] Appl. No.: 758,194

[22] Filed: Nov. 25, 1996

[30] Foreign Application Priority Data

Nov. 24, 1995 [JP] Japan .................................. 7-305342

[51] Int. Cl.[6] .................................................. G11C 11/34
[52] U.S. Cl. .................................... 365/185.18; 365/194
[58] Field of Search ........................ 365/185.18, 185.23, 365/185.12, 194

[56] References Cited

U.S. PATENT DOCUMENTS 4,267,603  5/1981  Osakabe et al. .................... 365/189.01
5,623,444  4/1997  Gotou et al. ........................ 365/185.23

Primary Examiner—David C. Nelms
Assistant Examiner—Michael T. Tran
Attorney, Agent, or Firm—Ostrolenk, Faber, Gerb & Soffen, LLP

[57] ABSTRACT

A nonvolatile memory includes a matrix array of nonvolatile memory cells arranged in rows and columns, ones of the memory cells arranged in rows being connected to word lines and ones of the memory cells arranged in columns being connected to bit lines. A selection logic circuitry receives programming data and produces a row selection signal and a column selection signal. A row decoder is responsive to the row selection signal for selecting one of the word lines, and a column decoder is responsive to the column selection signal for selecting at least one of the bit lines. When the nonvolatile memory is programmed, the programming data is supplied to the selection logic circuitry, and a write-in voltage is supplied to the row decoder for a period that is inversely variable with the write-in voltage so that hot electrons are trapped in the memory cell which is connected to the selected bit line as well as to the selected word line.

7 Claims, 2 Drawing Sheets

NONVOLATILE MEMORY FOR TRAPPING ELECTRONS IN SELECTED CELLS DURING A PERIOD INVERSELY VARIABLE WITH A WRITE-IN VOLTAGE

BACKGROUND OF THE INVENTION

1. Field of the Invention

The present invention relates generally to nonvolatile memories such as EEPROMs and flash memories, and more specifically to a technique for programming (or re-programming) a nonvolatile memory.

2. Description of the Related Art

Current techniques for programming a nonvolatile memory by trapping hot electrons in selected memory cells involve the application of a relatively high write-in voltage to the gate electrodes of the selected memory cells. However, due to possible fluctuation of the write-in voltage, the current programming operation suffers from disadvantages. For example, if the write-in voltage is too low, write-in operations will be repeated to ensure reliability, and if it is too high excessive stresses will be imposed on selected memory cells and the reliability of the memory will be adversely affected.

SUMMARY OF THE INVENTION

It is therefore an object of the present invention to ensure the reliability of a nonvolatile memory by preventing a varying write-in voltage from adversely affecting the trapping performance of memory cells when the memory is programmed or re-programmed.

According to the present invention, a nonvolatile memory is provided comprising a matrix array of nonvolatile memory cells arranged in rows and columns, ones of the memory cells arranged in rows being connected to word lines and ones of the memory cells arranged in columns being connected to bit lines, selection logic circuitry for receiving programming data and producing therefrom a row selection signal and a column selection signal, a row decoder responsive to the row selection signal for selecting one of the word lines, and a column decoder responsive to the column selection signal for selecting at least one of the bit lines. When the nonvolatile memory is programmed, the programming data is supplied to the selection logic circuitry, and a write-in voltage is supplied to the row decoder for a period that is inversely variable with the write-in voltage so that hot electrons are trapped in the memory cell which is connected to the selected bit line as well as to the selected word line.

In a specific aspect, a pulse generator is provided for producing a write-in pulse whose duration is inversely variable with the write-in voltage to define the period in which the write-in voltage is being applied to the row decoder.

BRIEF DESCRIPTION OF THE DRAWINGS

The present invention will be described in further detail with reference to the accompanying drawings, in which.

DETAILED DESCRIPTION

Figure 1:
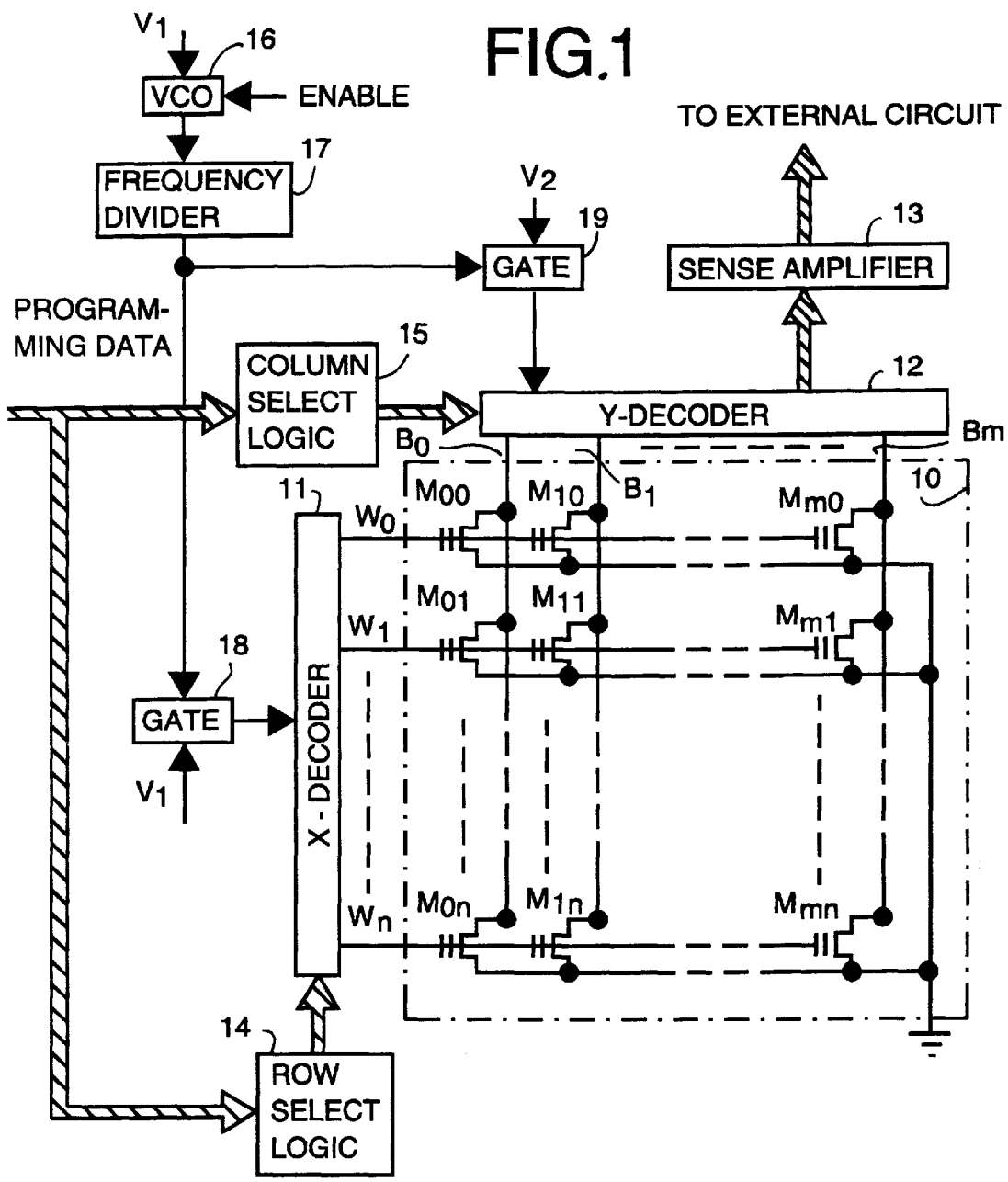
FIG. 1 is a block diagram of an EEPROM of the present invention.

In FIG. 1, the EEPROM (electrically erasable programmable read-only memory) of the present invention comprises a memory array 10 formed by memory cells $M_{00}$ to $M_{mn}$, an X-decoder 11, a Y-decoder 12 and a sense amplifier 13. The X-decoder 11 has word lines $W_0$ to $W_n$ respectively extending to the rows of the memory array 10 and the Y-decoder 12 has bit lines $B_0$ to $B_m$ respectively extending to the columns of the array. Each bit line is connected to the drain electrodes of the memory cells M of the corresponding column and each word line is connected to the gate electrodes of the memory cells of the corresponding row. The source electrodes of all memory cells are connected to ground.

Each memory cell is a field effect transistor having a floating gate buried in the silicon-dioxide insulation layer above which is the normal control gate. With no charge in this floating gate the control gate is ineffective in controlling the drain-source conductance, which is zero. When a 6-volt pulse is applied between the source and drain electrodes of a selected transistor and a 12-volt pulse is applied to the control gate, hot electrons are produced and subsequently trapped in this floating gate and the threshold voltage of the selected transistor is raised to a level higher than 6 volts. During read-out operation, 5-volt power supply voltage ($V_{cc}$) is applied to the control gate of both programmed and non-programmed transistors of a selected row. Since it is lower than the threshold voltage, the programmed transistors remain nonconductive, while the non-programmed transistors become conductive for switching the source-drain current. Because of the very high insulating properties of silicon dioxide, the trapped charge remains for a very long period. In this specification, the voltage supplied to the gate electrode necessary for charge trapping is designated as $V_1$ and the voltage applied to the drain electrode is designated as $V_2$. The voltage $V_1$ does not necessarily remain constant. It varies from user to user due to possible differences in source voltages as well as from time to time due to aging. Such voltage variations significantly affect the amount of charge trapped in selected memory cells.

Programming data is supplied to a row select logic 14 and a column select logic 15. Row select logic 14 is connected to the X-decoder 11 to select a word line and column select logic 15 to the Y-decoder 12 to select one or more bit lines.

According to this invention, a voltage-controlled oscillator 16 is provided. During programming, VCO 16 is enabled to respond to the write voltage $V_1$ for producing an output whose frequency is proportional to $V_1$. The VCO output is applied to a frequency divider 17 where the VCO frequency is divided and write-in pulses are produced. Thus, the duration of the write-in pulse is inversely proportional to the VCO output frequency and hence to the write voltage $V_1$. The duration of the write-in pulse determines the duration in which the voltages $V_1$ and $V_2$ are applied to the selected memory cell for trapping charge in the floating gate.

The output of frequency divider 17 is applied to gates 18 and 19 which are respectively connected to the X-decoder 11 and the Y-decoder 12. Gate 18 is activated by a write-in pulse from divider 17 and voltage $V_1$ is passed through the X-decoder 11 to a selected word line, and gate 19 is activated by the same write-in pulse and voltage $V_2$ is supplied through the Y-decoder 12 to one or more selected bit lines. Those word and bit lines, which are not selected, are maintained at zero-volt level.

If memory cells $M_{00}$ and $M_{10}$ are selected, voltage $V_1$ is applied to their gate electrode and voltage $V_2$ to their drain electrode. Charge trapping operations occur in these memory cells and continue for the duration of the write-in pulse from the frequency divider 17. If the voltage $V_1$ is relatively low, the VCO output frequency is relatively low and the duration of its output pulse becomes relatively long. As a result, the charge trapping operations of the selected memory cells continue for a relatively long duration. If the voltage $V_1$ is relatively high, the charge trapping duration is continued for a relatively short duration. The charge trapping period is therefore adaptively controlled with voltage $V_1$ and the variability of voltage $V_1$ are automatically compensated. The amount of hot electrons trapped in the programmed memory cells is independent of the varying voltage $V_1$ and the reliability of the EEPROM is increased.

Figure 2:
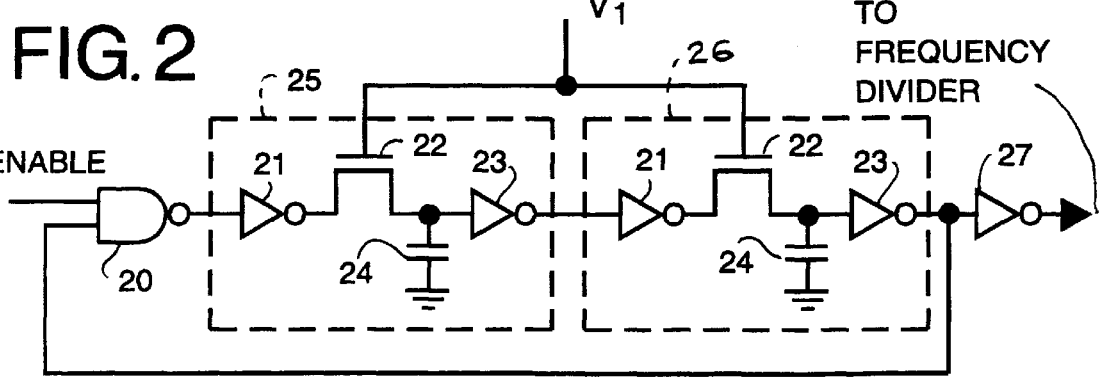
FIG. 2 is a circuit diagram of a preferred variable frequency oscillator.

In a preferred embodiment shown in FIG. 2, the voltage-controlled oscillator 16 is of ring oscillator configuration formed with a NAND gate 20 to the first input of which an enable signal is applied. The output of NAND gate 20 is connected to a first variable delay circuit 25 comprising an inverter 21, a transistor 22 and an inverter 23 connected in a series circuit from the output of NAND gate 20 and a capacitor 24 coupling the junction between transistor 22 and inverter 23 to ground. Inverters 21 and 23 are fixed delay elements. Transistor 22 is of N-channel depletion type and the control gate of this transistor is supplied with voltage $V_1$ so that the conductance of its drain-source path is variable with the gate voltage and forms a variable delay element with capacitor 24. The output of the first variable delay circuit 25 is coupled to a second variable delay circuit 26 which is identical to the first. The output signal of the second variable delay circuit 26 is connected to the second input of NAND gate 20 as a feedback signal to form a variable-frequency oscillation loop. The conductance of the transistors of both variable delay circuits 25, 26 varies inversely with their gate voltage $V_1$ and so their time constant and hence the frequency of the resultant oscillation varies with voltage $V_1$. The output of the second variable delay circuit 26 is applied through an inverter 27 to the frequency divider 17.

Figure 3:
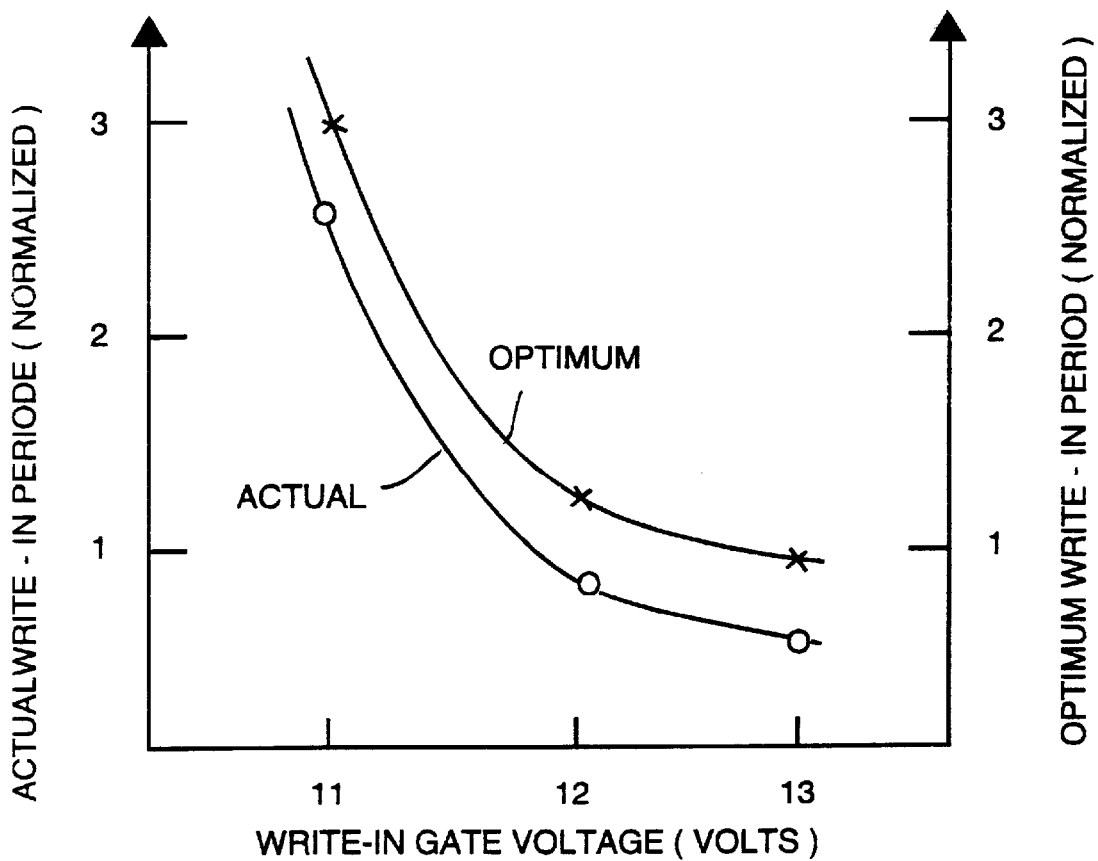
FIG. 3 is a graphic representation of an optimum write-in period curve for write-in gate voltages in comparison with an actual write-in period curve obtained by the present invention.

Experiments were made to plot write-in periods as a function of gate voltage applied during programming taken for a memory cell to reach a threshold level at which it can be determined that a sufficient amount of hot electrons are trapped in the memory cell. As illustrated in FIG. 3, the write-in period curve of the present invention is nonlinear and generally follows the optimum write-in period curve.

Figure 4:
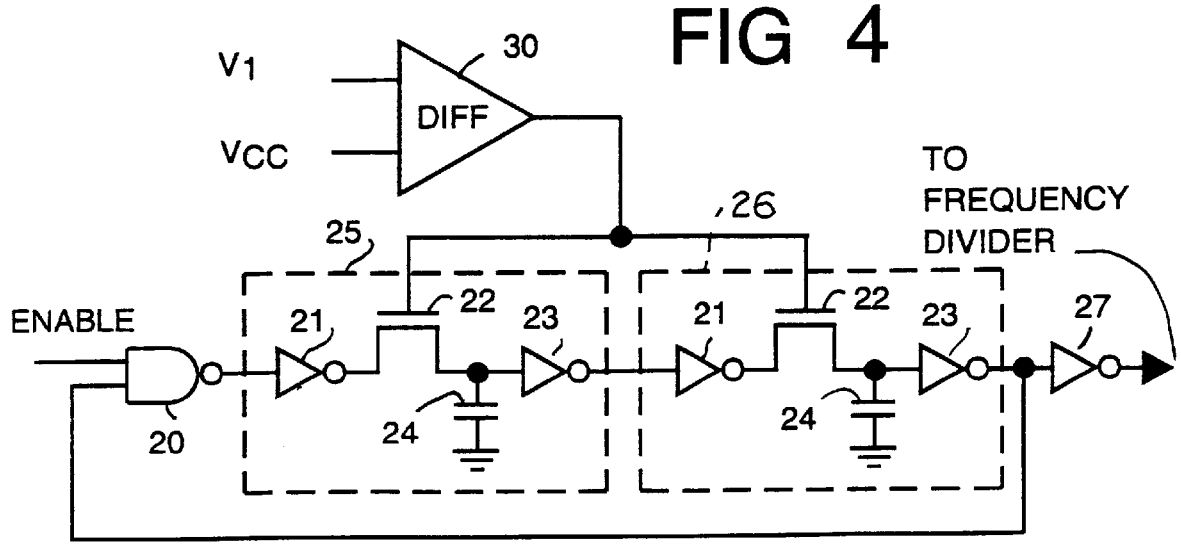
FIG. 4 is a circuit diagram of a modified variable frequency oscillator.

A modified form of the VCO 16 is shown in FIG. 4. In this modification, a differential amplifier 30 is provided for comparing the write-in gate voltage $V_1$ with the normal operating source voltage $V_{CC}$ to produce a difference voltage. Since the source voltage $V_{CC}$ is relatively stable in comparison with the high write-in gate voltage $V_1$, it can be used as a reference potential to produce a signal indicating the amount of deviation of the write-in gate voltage with respect to the reference potential. The output of differential amplifier 30 is applied to the gate electrodes of transistors 22 of both variable delay circuits 25, 26.

What is claimed is:

1. A nonvolatile memory comprising:
   a matrix array of nonvolatile memory cells arranged in rows and columns, the memory cells being arranged in rows connected to word lines and arranged in columns connected to bit lines;
   selection logic circuitry for receiving programming data and producing therefrom a row selection signal and a column selection signal;
   a row decoder responsive to the row selection signal for selecting at least one of said word lines;
   a column decoder responsive to the column selection signal for selecting at least one of said bit lines;
   a pulse generator for producing a write-in pulse whose duration is inversely proportional to the magnitude of a write-in voltage; and
   gate means for supplying said write-in voltage to said row decoder in response to the write-in pulse for trapping hot electrons in the memory cell which is connected to said at least one selected bit line as well as to the selected word line, whereby the amount of the trapped hot electrons is independent of said write-in voltage.

2. A nonvolatile memory as claimed in claim 1, wherein said pulse generator comprises a variable frequency oscillator for producing an oscillation signal whose frequency is variable with said write-in voltage, and a frequency divider for dividing the frequency of the oscillation signal to produce said write-in pulse.

3. A nonvolatile memory as claimed in claim 2, wherein said variable frequency oscillator comprises:
   a gate having first and second input terminals and an output terminal; and
   at least one variable delay circuit connected to the output terminal of the gate for providing a variable delay to an output signal of the gate in accordance with said write-in voltage and supplying the delayed signal to the second input terminal of the gate, whereby an oscillation occurs in a closed loop when said first input terminal of the gate is activated.

4. A nonvolatile memory as claimed in claim 3, further comprising means for comparing the write-in voltage with a reference voltage and producing a difference voltage representative of the difference between the write-in voltage and the reference voltage, said at least one variable delay circuit being responsive to the difference voltage for delaying the output signal of the gate.

5. A nonvolatile memory as claimed in claim 2, wherein said variable frequency oscillator comprises:
   a gate having first and second input terminals and an output terminal;
   a first variable delay circuit connected to the output terminal of the gate for providing a variable delay to an output signal of the gate in accordance with said write-in voltage to produce a delayed output signal; and
   a second variable delay circuit for providing an additional variable delay to said delayed output signal in accordance with said write-in voltage and supplying the additionally delayed signal to the second input terminal of the gate, whereby an oscillation occurs in a closed loop when said first input terminal of the gate is activated.

6. A nonvolatile memory as claimed in claim 5, further comprising means for comparing the write-in voltage with a reference voltage and producing a difference voltage representative of the difference between the write-in voltage and the reference voltage, said first and second variable delay circuits being responsive to the difference voltage for delaying the output signal of the gate.

7. In a nonvolatile memory comprising a matrix array of nonvolatile memory cells arranged in rows and columns, the memory cells being arranged in rows connected to word lines and arranged in columns connected to bit lines, selection logic circuitry for receiving programming data and producing therefrom a row selection signal and a column selection signal, a row decoder responsive to the row selection signal for selecting one of said word lines, and a column decoder responsive to the column selection signal for selecting at least one of said bit lines, a method comprising the steps of:

a) supplying said programming data to said selection logic circuitry for selecting at least one bit line and said one of the word lines; and b) supplying a write-in voltage to said row decoder for a period of inversely proportional to a magnitude of write-in voltage so that hot electrons are trapped in the memory cell which is connected to said at least one selected bit line as well as to the selected word line, whereby the amount of the trapped hot electrons is independent of said write-in voltage.

* * * * *